(12) United States Patent
Kishida

(10) Patent No.: US 7,156,935 B2
(45) Date of Patent: *__Jan. 2, 2007__

(54) METHOD OF MANUFACTURING CERAMIC LAMINATED BODY

(75) Inventor: Kazuo Kishida, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/481,644

(22) PCT Filed: Apr. 4, 2003

(86) PCT No.: PCT/JP03/04313

§ 371 (c)(1),
(2), (4) Date: Dec. 22, 2003

(87) PCT Pub. No.: WO03/090987

PCT Pub. Date: Nov. 6, 2003

(65) Prior Publication Data
US 2004/0207134 A1    Oct. 21, 2004

(30) Foreign Application Priority Data
Apr. 26, 2002 (JP) ............................. 2002-127411

(51) Int. Cl.
B32B 38/04 (2006.01)
B32B 38/10 (2006.01)
C03B 29/00 (2006.01)
H05K 3/46 (2006.01)

(52) U.S. Cl. ............... 156/89.24; 156/89.11; 156/89.12; 156/267; 156/268

(58) Field of Classification Search ............ 156/89.11, 156/89.12, 89.16, 268; 264/642, 678, 614, 264/618, 672
See application file for complete search history.

(56) References Cited

U.S. PATENT DOCUMENTS

| | | | |
|---|---|---|---|
| 6,004,705 A * | 12/1999 | Masaki et al. ................ | 430/15 |
| 6,159,322 A * | 12/2000 | Ogata et al. ................ | 156/230 |
| 2003/0000079 A1* | 1/2003 | Harada et al. ................ | 29/830 |
| 2003/0008182 A1* | 1/2003 | Saitoh et al. ................ | 428/699 |
| 2003/0062111 A1* | 4/2003 | Moriya .................... | 156/89.12 |
| 2005/0008824 A1* | 1/2005 | Kawakami et al. ......... | 428/167 |

FOREIGN PATENT DOCUMENTS

| | | | |
|---|---|---|---|
| EP | 1 272 020 | * | 1/2003 |
| JP | 54-79498 | * | 6/1979 |
| JP | 62-128194 | * | 6/1987 |
| JP | 62-128194 A1 | | 6/1987 |
| JP | 64-28995 | | 1/1989 |

(Continued)

OTHER PUBLICATIONS

Japanese Office Action issued Jun. 27, 2006 (w/ English translation of relevant portions).

*Primary Examiner*—Melvin Mayes
(74) *Attorney, Agent, or Firm*—Dickstein, Shapiro, LLP.

(57) ABSTRACT

Unfired first ceramic layers 11 and at least one unfired second ceramic layer 12 having a different color from the unfired first ceramic layers 11 are laminated to prepare an unfired ceramic laminate 13. Notches 14 are then formed on a surface of the unfired ceramic laminate 13 using the second ceramic layer 12 as a reference. The unfired ceramic laminate 13 is fired to provide a fired ceramic laminate 13a, which is then divided along the notches 14 into ceramic composites 13b. In this process, notches having the proper depth can be formed on the unfired ceramic laminate 13.

15 Claims, 5 Drawing Sheets

FOREIGN PATENT DOCUMENTS

| | | |
|---|---|---|
| JP | 5-13084 | 2/1993 |
| JP | 5-102666 | 4/1993 |
| JP | 08-037250 | 2/1996 |
| JP | 08-339937 | 12/1996 |
| JP | 09-018147 | 1/1997 |
| JP | 09-046044 | 2/1997 |
| JP | 10-200261 * | 7/1998 |
| JP | 2000-176928 * | 6/2000 |
| JP | 2002/76622 * | 3/2002 |
| JP | 2003-17851 * | 1/2003 |
| WO | 02/43455 * | 5/2002 |

* cited by examiner (a)

(b)

METHOD OF MANUFACTURING CERAMIC LAMINATED BODY

TECHNICAL FIELD

The present invention relates to methods for manufacturing ceramic composites. These methods include a step of dividing a ceramic laminate along notches into ceramic composites.

BACKGROUND ART

Japanese Unexamined Patent Application Publication No. 8-37250 discloses a method for dividing an unfired ceramic laminate along notches to manufacture a large amount of ceramic multilayer substrates. According to this method, as shown in FIG. 5 (a), unfired ceramic layers 41 are laminated into an unfired ceramic laminate 42. Notches 43 are formed on a main surface of the unfired ceramic laminate 42, which is then fired. Referring to FIG. 5 (b), the fired ceramic laminate 42 is divided along the notches 43 into ceramic composites 42a.

However, if all the unfired ceramic layers 41 have the same color (for example, white), the boundaries between the ceramic layers 41 are difficult to identify. This makes it difficult to form uniform notches 43 having the proper depth.

That is, if the depth of the notches 43 is excessively small, the fired ceramic laminate 42 may not be divided into the ceramic composites 42a. On the other hand, if the depth of the notches 43 is excessively large, the fired ceramic laminate 42 or the ceramic composites 42a may exhibit cracking or chipping. Such cracking and chipping occur due to stresses generated when, for example, a wiring pattern on the fired ceramic laminate 42 is plated, components are mounted on the fired ceramic laminate 42, or the fired ceramic laminate 42 is divided along the notches 43.

The depth of the notches 43 may be determined by measuring the thickness of the unfired ceramic layers 41 in advance. This method, however, is unsatisfactory because the unfired ceramic laminate 42 is clamped and this changes the thickness of each ceramic layer 41.

The present invention is aimed at solving the above problems. An object of the present invention is to provide a method for manufacturing ceramic composites having little deformation and few cracks and chips by forming notches having the proper depth on a ceramic laminate.

DISCLOSURE OF INVENTION

The present invention provides a method for manufacturing ceramic composites. This method includes a first step of laminating unfired first ceramic layers containing a first ceramic material and at least one unfired second ceramic layer containing a second ceramic material and a colorant and having a different color from the first ceramic layers to prepare an unfired ceramic laminate; a second step of forming notches on a surface of the unfired ceramic laminate using the at least one second ceramic layer as a reference; a third step of firing the unfired ceramic laminate; and a fourth step of dividing the fired ceramic laminate along the notches on the surface thereof.

In this method for manufacturing ceramic composites according to the present invention, the ends of the notches formed in the second step may be in the at least one second ceramic layer. Also, these ends of the notches may extend through the at least one second ceramic layer. Alternatively, these ends of the notches may be in one first ceramic layer adjacent to the main surface of the at least one second ceramic layer facing the openings of the notches.

In this method for manufacturing ceramic composites according to the present invention, in the first step, the unfired ceramic laminate may include the unfired first ceramic layers which are laminated into an unfired substrate ceramic laminate; and the at least one unfired second ceramic layer containing the second ceramic material which is unsinterable at a sintering temperature of the first ceramic material, the at least one unfired second ceramic layer being laminated on the top and bottom surfaces of the unfired substrate ceramic laminate. In the second step, the ends of the notches may extend through the at least one second ceramic layer into the substrate ceramic laminate. In the third step, the unfired ceramic laminate may be fired at a temperature at which the first ceramic material is sintered and the second ceramic material is not sintered. In the fourth step, the at least one second ceramic layer may be removed from the fired ceramic laminate to provide the fired substrate ceramic laminate before the fired ceramic laminate is divided along the notches on the surface thereof.

In this method for manufacturing ceramic composites according to the present invention, in the first step, the unfired ceramic laminate may include the at least one unfired second ceramic layer which is laminated into an unfired substrate ceramic laminate; and the unfired first ceramic layers containing the first ceramic material which is unsinterable at a sintering temperature of the second ceramic material, the unfired first ceramic layers being laminated on the top and bottom surfaces of the unfired substrate ceramic laminate. In the second step, the ends of the notches may extend through the first ceramic layers into the substrate ceramic laminate. In the third step, the unfired ceramic laminate may be fired at a temperature at which the second ceramic material is sintered and the first ceramic material is not sintered. In the fourth step, the first ceramic layers may be removed from the fired ceramic laminate to provide the fired substrate ceramic laminate before the fired substrate ceramic laminate is divided along the notches on the surface thereof.

In the method for manufacturing ceramic composites according to the present invention, the colorant is preferably burned off in the third step.

This method for manufacturing ceramic composites according to the present invention preferably further includes a step of mounting a component on a main surface of the fired substrate ceramic laminate. In addition, the ceramic composites may be ceramic electronic components, which have internal and external electrodes.

The method for manufacturing ceramic composites according to the present invention allows formation of notches having the proper depth on the unfired ceramic laminate using the colored unfired second ceramic layer as a reference. This prevents notches having an excessively small depth, which make it difficult to divide the ceramic laminate, and notches having an excessively large depth, which cause cracks or chips on the ceramic laminate.

BEST MODE FOR CARRYING OUT THE INVENTION (First Embodiment)

A method for manufacturing ceramic composites according to an embodiment of the present invention will now be described.

<First Step>

Figure 1:
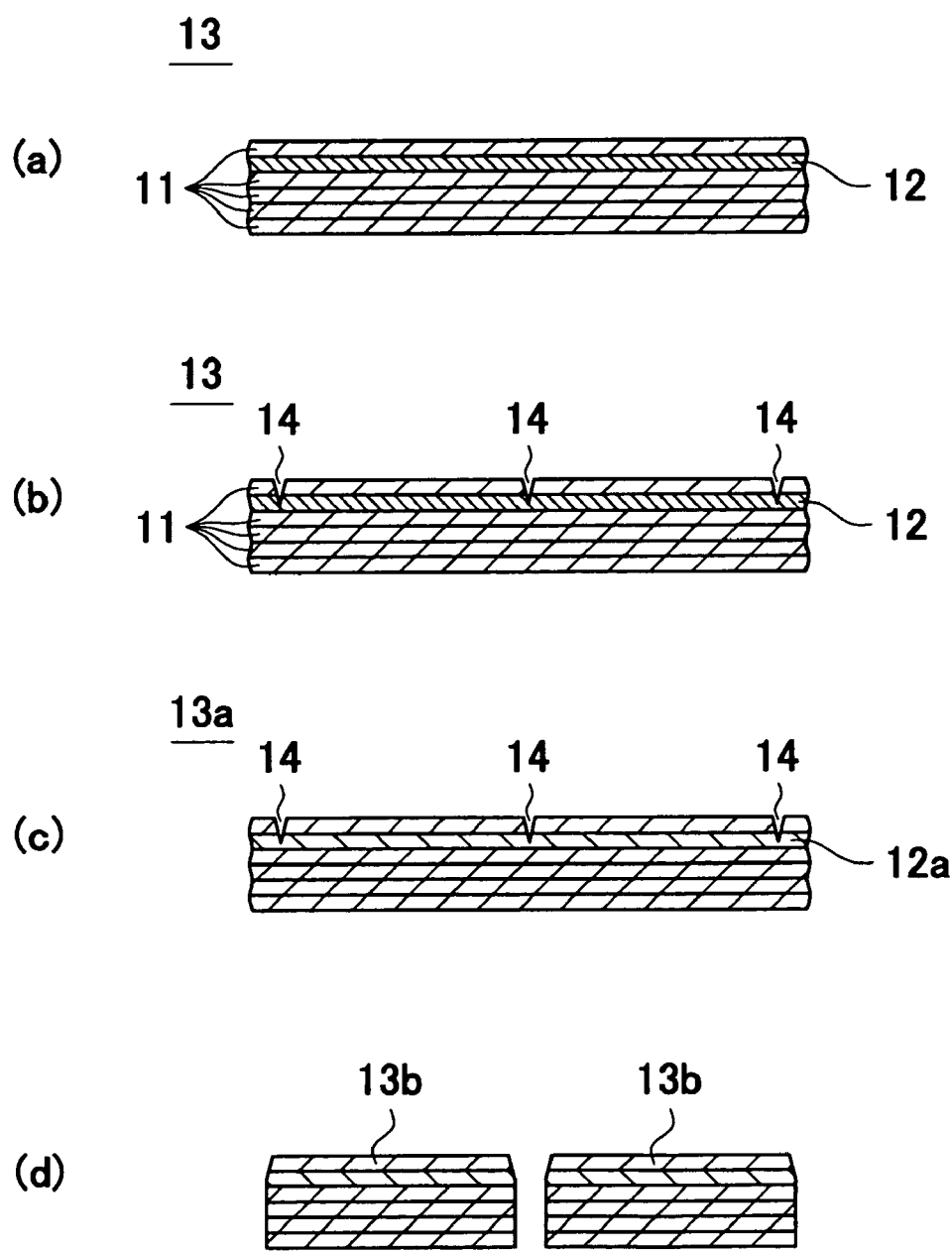
FIGS. 1 (a) to 1 (d) show sectional views illustrating the steps of a method for manufacturing ceramic composites according to an embodiment of the present invention.

Referring to FIG. 1 (a), in the first step, unfired first ceramic layers 11 and at least one unfired second ceramic layer 12 having a different color from the first ceramic layers 11 are laminated to prepare an unfired ceramic laminate 13.

The unfired first ceramic layers 11 contain a first ceramic material. A material having a low sintering temperature, particularly, a material that can be fired at 1000° C. or less, is preferably used as the first ceramic material so that the first ceramic layers 11 can be co-fired (fired at the same time) with a wiring pattern of a high-conductivity, low melting point metal, such as silver and copper. In addition, the first ceramic material preferably has a low relative dielectric constant so as not to delay signals communicated between internal electrodes. Among preferred examples of the first ceramic material is a mixture of $Al_2O_3$ ceramic and $CaO-SiO_2-B_2O_3$ glass.

The unfired first ceramic layers 11 mainly have a color inherent to the first ceramic material. For example, the first ceramic layers 11 containing the mixture of $Al_2O_3$ ceramic and $CaO-SiO_2-B_2O_3$ glass as the first ceramic material are white.

The unfired second ceramic layer 12 contains a second ceramic material. In this embodiment, the second ceramic material may be the same as the first ceramic material. The unfired second ceramic layer 12 further contains a colorant so that the unfired second ceramic layer 12 has a different color from the unfired first ceramic layers 11.

Examples of the colorant include pigments and dyes of various colors. The colorant is preferably burned off during the firing of the unfired ceramic laminate 13. This is because the colorant, remaining during the firing, may decrease the sinterability of the ceramic laminate 13, and, remaining after the firing, may decrease the commercial value of the fired ceramic laminate 13. For example, the unfired ceramic laminate 13, if fired at 1000° C., preferably contains a colorant that is burned off at 1000° C. or less. Examples of such a colorant include azo dyes. Containing a colorant of about 0.001 weight percent, the unfired second ceramic layer 12 can be sufficiently colored. The content of the colorant is preferably 0.01 or less weight percent and more preferably 0.005 or less weight percent.

The first ceramic layers 11 may contain a colorant as long as the unfired first ceramic layers 11 has a different color from the unfired second ceramic layer 12.

The unfired first ceramic layers 11 and the unfired second ceramic layer 12 are made of ceramic green sheets formed by casting a ceramic slurry into sheets by a doctor glade process. The ceramic slurry is prepared by mixing the first ceramic material or the second ceramic material and proper amounts of binder, plasticizer, and solvent. The ceramic green sheets may be laminated and clamped in the lamination direction by mechanical pressing or isostatic pressing.

A wiring pattern, if necessary, is formed on the unfired first ceramic layers 11 or the unfired second ceramic layer 12. For example, a metal powder and proper amounts of binder, glass powder, and dispersant are mixed to prepare a conductive paste, which is then printed on a ceramic green sheet by screen printing to prepare the wiring pattern.

A via hole, if necessary, is formed in the unfired first ceramic layers 11 or the unfired second ceramic layer 12. This via hole is filled with a conductive paste to form a via conductor. The via hole may be formed by, for example, perforating a green sheet with a puncher or a laser.

Each of the first and second ceramic materials is not limited to one kind of material. The unfired ceramic laminate 13 may include unfired first ceramic layers 11 each containing a different first ceramic material and unfired second ceramic layers 12 each containing a different second ceramic material.

<Second Step>

Referring to FIG. 1 (b), in the second step, notches 14 are formed on the top surface of the unfired ceramic laminate 13 using the second ceramic layer 12 as a reference. In this embodiment, the ends of the notches 14 are in the second ceramic layer 12. The second ceramic layer 12, which is colored, ensures formation of uniform notches 14 having the proper depth on the unfired ceramic laminate 13. The unfired ceramic laminate 13, having the notches 14 on one main surface in FIG. 1 (b), may have the notches 14 on both main surfaces.

Figure 2:
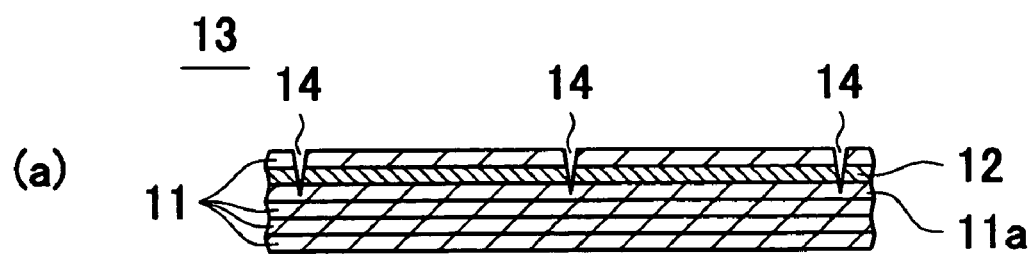
FIGS. 2 (a) and 2 (b) show sectional views illustrating modifications of a ceramic laminate in FIG. 1 (b).
Figure 2:
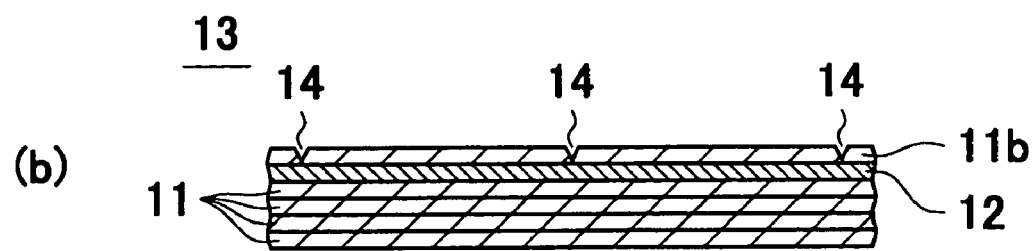

The notches 14 may have different depths using the colored second ceramic layer as a reference. For example, as shown in FIG. 2 (a), the notches 14 may extend through the second ceramic layer 12 into one first ceramic layer 11a adjacent to the main surface of the second ceramic layer 12 facing the ends of the notches 14. In this case, the colored second ceramic layer is exposed from the notches, thus facilitating burning-off of the colorant. Alternatively, as shown in FIG. 2 (b), the notches 14 may not extend through the second ceramic layer 12 but be in one first ceramic layer 11b adjacent to the main surface of the second ceramic layer 12 facing the openings of the notches 14.

<Third Step>

Referring to FIG. 1 (c), in the third step, the unfired ceramic laminate 13 having the notches 14 is fired to provide a fired ceramic laminate 13a having the notches 14. According to this embodiment, the unfired second ceramic layer 12 contains the colorant that is burned off during the firing; therefore, at least one fired second ceramic layer 12a in FIG. 1 (c) is illustrated (hatched) differently from the unfired second ceramic layer 12 in FIGS. 1 (a) and 1 (b).

<Fourth Step>

Referring to FIG. 1 (d), in the fourth step, the fired ceramic laminate 13a is divided along the notches 14 into ceramic composites 13b.

Components may be mounted on main surfaces of the ceramic composites 13b to prepare modules. In such cases, the components may be mounted on a main surface of the ceramic laminate 13a before the ceramic laminate 13a is divided, or may be mounted on main surfaces of the separated ceramic composites 13b.

(Second Embodiment)

A method for manufacturing ceramic composites according to another embodiment of the present invention will now be described.

<First Step>

Figure 3:
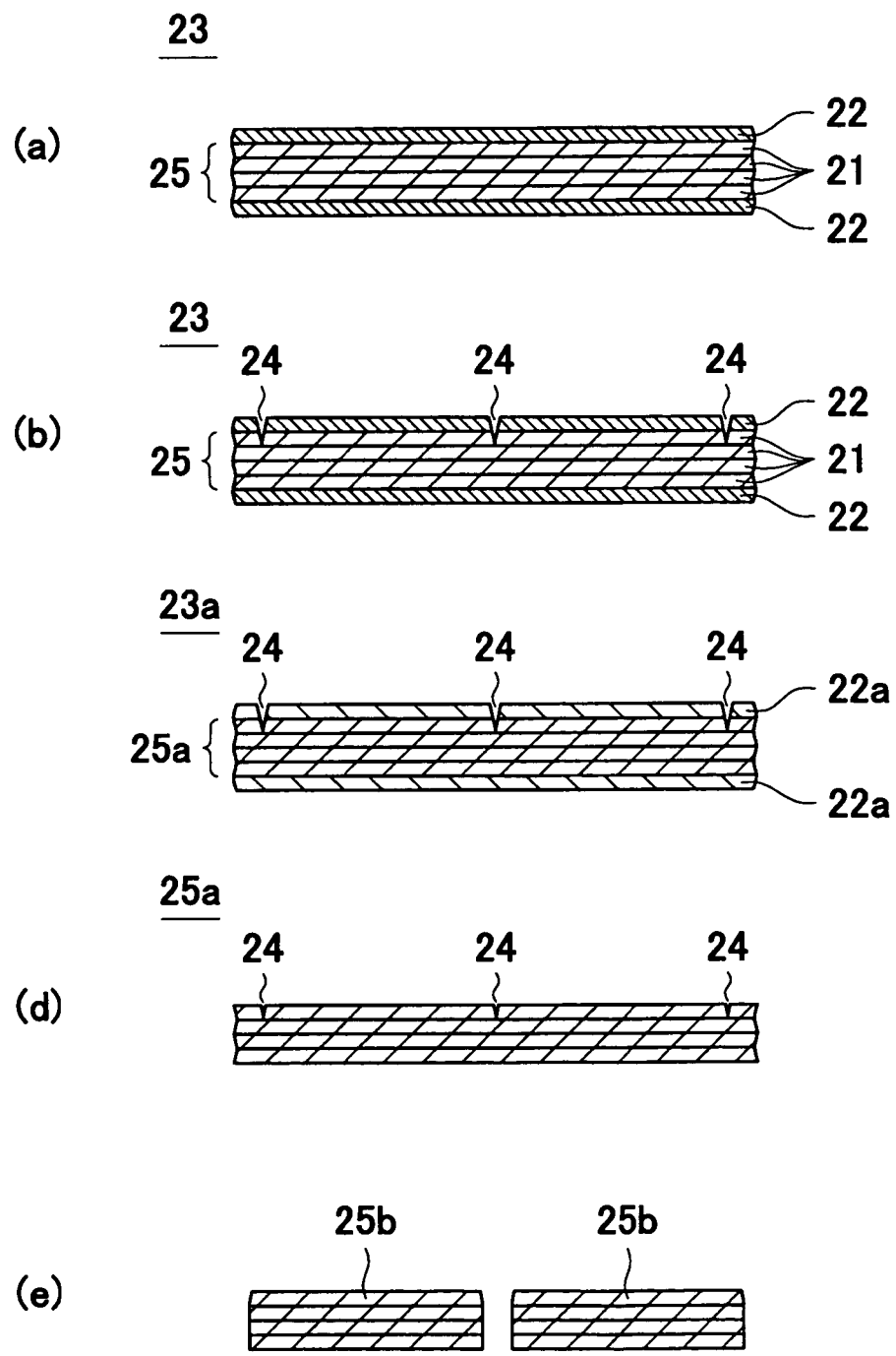
FIGS. 3 (a) to 3 (e) show sectional views illustrating the steps of a method for manufacturing ceramic composites according to another embodiment of the present invention.

Referring to FIG. 3 (a), in the first step, unfired first ceramic layers 21 are laminated into an unfired substrate ceramic laminate 25, and then second ceramic layers 22 are laminated on the top and bottom surfaces of the unfired substrate ceramic laminate 25 to prepare an unfired ceramic laminate 23.

In this embodiment, the second ceramic layers 22, which are colored, contain a second ceramic material that is not sintered at a sintering temperature of the first ceramic material. These second ceramic layers 22 are laminated as the outermost layers of the unfired ceramic laminate 23.

If, for example, the first ceramic material can be fired at 1000° C. or less, a ceramic material such as $Al_2O_3$ and $ZrO_2$ may be used as the second ceramic material. If different kinds of first ceramic materials are used, "the sintering temperature of the first ceramic material" here means the highest sintering temperature among the sintering temperatures of the first ceramic materials.

In this embodiment, a single unfired second ceramic layer 22 is formed on each outermost surface of the unfired ceramic laminate 23; however, a plurality of unfired second ceramic layers 22 may be formed on each outermost surface of the unfired ceramic laminate 23. Additionally, in FIG. 3(a), an unfired ceramic layer containing the second ceramic material, which is not sintered at the sintering temperature of the first ceramic material, and no colorant may be further laminated on the unfired second ceramic layers 22.

<Second Step>

Referring to FIG. 3 (b), in the second step, notches 24 are formed on the unfired ceramic laminate 23. These notches 24 extend through the second ceramic layers 22 into the substrate ceramic laminate 25.

<Third Step>

Referring to FIG. 3 (c), in the third step, the unfired ceramic laminate 23 having the notches 24 is fired to provide a fired ceramic laminate 23a having the notches 24. According to this embodiment, the second ceramic layers 22 contain a colorant that is burned off during the firing; therefore, fired second ceramic layers 22a in FIG. 3(c) are illustrated (hatched) differently from the unfired second ceramic layers 22 in FIGS. 3 (a) and 3 (b).

The ceramic laminate 23 is fired at a temperature at which the first ceramic material is sintered and the second ceramic material is not substantially sintered. During the firing, therefore, the second ceramic layers 22, which do not substantially shrink by sintering, restrain the shrinkage across the plane of the fired first ceramic layers 21. This suppresses the warpage or deformation of a fired substrate ceramic laminate 25a.

<Fourth Step>

Referring to FIG. 3 (d), in the fourth step, the fired second ceramic layers 22a are removed from the fired ceramic laminate 23a to provide the substrate ceramic laminate 25a having the notches 24a.

Referring then to FIG. 3 (e), the fired substrate ceramic laminate 25a is divided along the notches 24a to provide a plurality of ceramic composites 25b.

The details of the other parts and steps which are the same as in the first embodiment are not described.

(Third Embodiment)

A method for manufacturing ceramic composites according to still another embodiment of the present invention will now be described.

<First Step>

Figure 4:
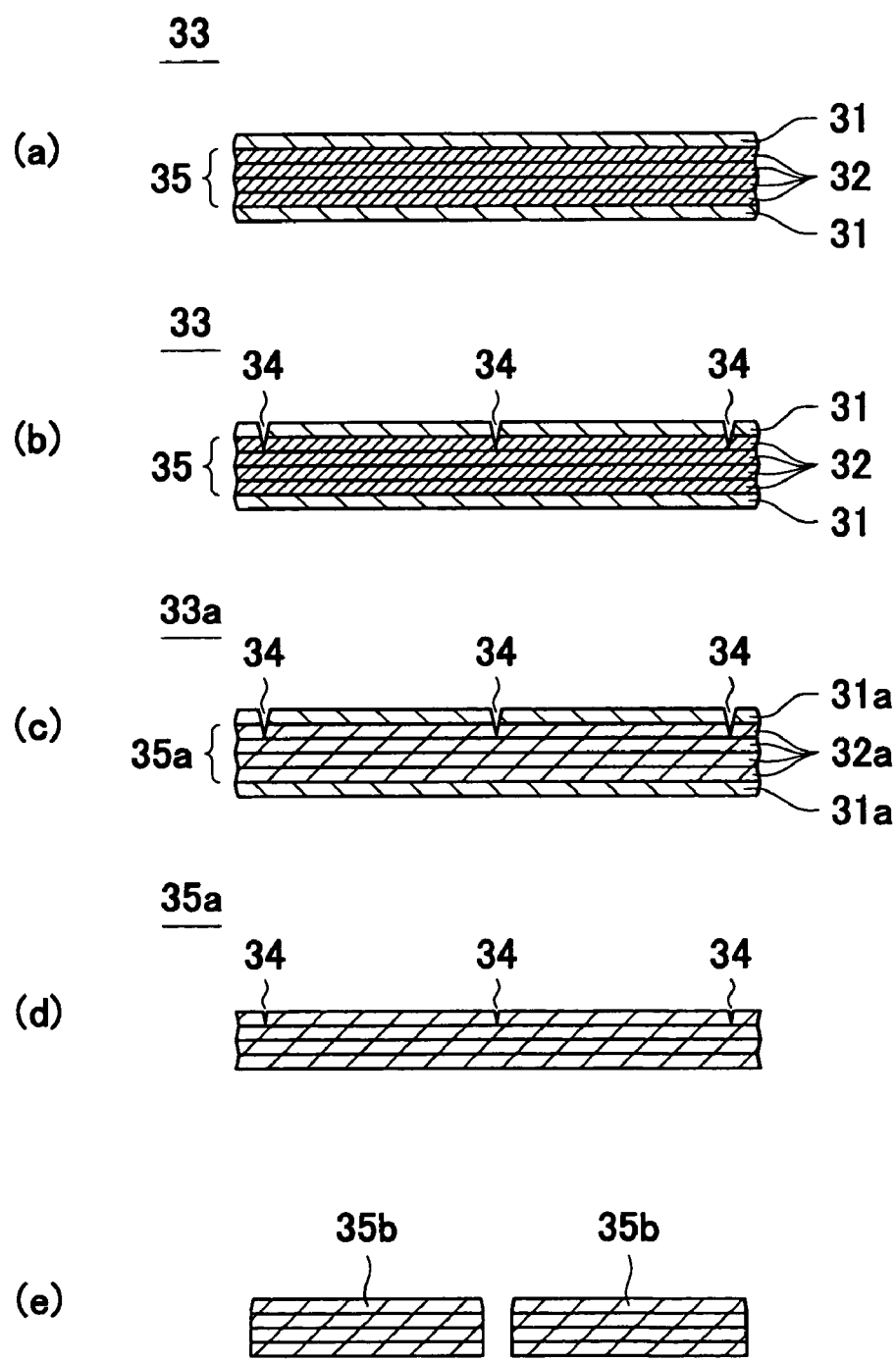
FIGS. 4 (a) to 4 (e) show sectional views illustrating the steps of a method for manufacturing ceramic composites according to still another embodiment of the present invention.
Figure 5:
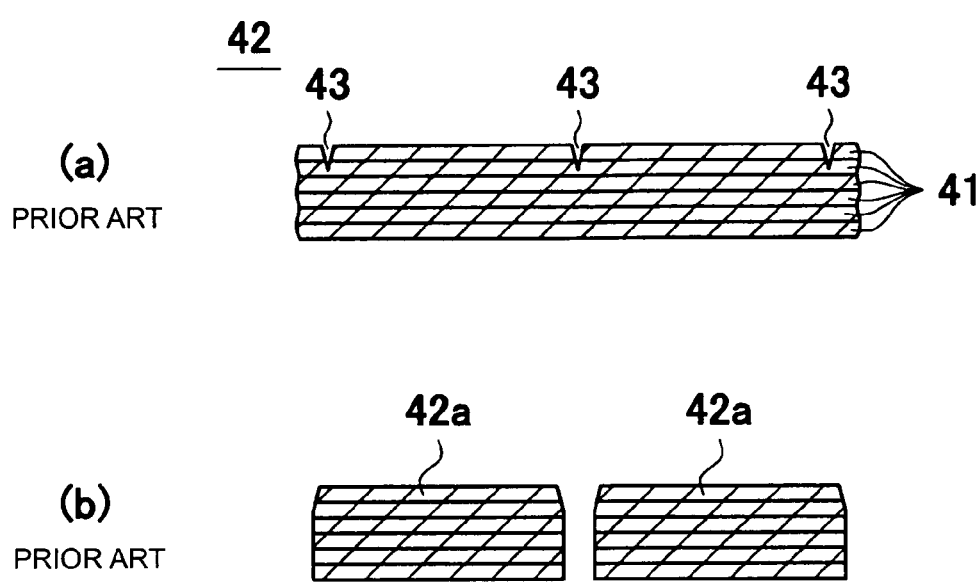
FIGS. 5 (a) and 5 (b) sectional views illustrating the steps of a known method for manufacturing ceramic composites.

Referring to FIG. 4 (a), in the first step, unfired second ceramic layers 32 are laminated into an unfired substrate ceramic laminate 35, and then first ceramic layers 31 are laminated on the top and bottom surfaces of the unfired substrate ceramic laminate 35 to prepare an unfired ceramic laminate 33.

In this embodiment, the first ceramic layers 31 contain a first ceramic material that is not sintered at the sintering temperature of the second ceramic material. These first ceramic layers 31 are laminated as the outermost layers of the unfired ceramic laminate 33. The second ceramic layers 32 are colored in the substrate ceramic laminate 35.

<Second Step>

Referring to FIG. 4 (b), in the second step, notches 34 are formed on the unfired ceramic laminate 33. These notches 34 extend through the first ceramic layers 31 into the substrate ceramic laminate 35.

<Third Step>

Referring to FIG. 4 (c), in the third step, the unfired ceramic laminate 33 having the notches 34 is fired to provide a fired ceramic laminate 33a having the notches 34. According to this embodiment, the second ceramic layers 32 contain a colorant that is burned off during the firing; therefore, fired second ceramic layers 32a in FIG. 4 (c) are illustrated (hatched) differently from the unfired second ceramic layers 32 in FIGS. 4 (a) and 4 (b).

The ceramic laminate 33 is fired at a temperature at which the second ceramic material is sintered and the first ceramic material is not sintered. During the firing, therefore, the first ceramic layers 31, which do not substantially shrink by sintering, restrain the shrinkage across the plane of the fired second ceramic layers 32. This suppresses the warpage or deformation of a fired substrate ceramic laminate 35a.

<Fourth Step>

Referring to FIG. 4 (d), in the fourth step, fired first ceramic layers 31a are removed from the fired ceramic laminate 33a to provide the substrate ceramic laminate 35a having the notches 34a.

Referring then to FIG. 4 (e), the fired substrate ceramic laminate 35a is divided along the notches 34a to provide a plurality of ceramic composites 35b.

The details of the other parts and steps which are the same as in the first embodiment are not described.

EXAMPLE

Ceramic composites were actually manufactured by the method for manufacturing ceramic composites according to the second embodiment, and then were evaluated. The manufacturing process and evaluations of these ceramic composites will now be described.

First, an $Al_2O_3$ powder of 50 weight percent and a $CaO$—$SiO_2$—$B_2O_3$ glass powder of 50 weight percent were mixed to prepare a first ceramic material. This first ceramic material and proper amounts of toluene, as a solvent, polyvinyl butyral, as a binder, and dioctyl phthalate, as a plasticizer, were mixed to prepare a slurry. This slurry was then cast by a doctor blade process into ceramic green sheets having a thickness of 100 μm, which are referred to as first ceramic green sheets. These first ceramic green sheets were white.

On the other hand, an Al$_2$O$_3$ powder, as the second ceramic material, and proper amounts of toluene, as a solvent, polyvinyl butyral, as a binder, dioctyl phthalate, as a plasticizer, and azo dye (Kayaset Red B made by NIPPON KAYAKU CO., LTD.), as a colorant, were mixed to prepare a slurry. This slurry was then cast by a doctor blade process into ceramic green sheets having a thickness of 100 μm, which are referred to as second ceramic green sheets. These second ceramic green sheets were red.

Next, 13 first ceramic green sheets were laminated into an unfired substrate ceramic laminate. The top layer of the unfired substrate ceramic laminate had a wiring pattern of Ag paste on one main surface thereof. Then, 4 second ceramic green sheets were laminated on each of the top and bottom surfaces of the unfired substrate ceramic laminate to prepare an unfired ceramic laminate having a thickness of 2.1 mm, which was then clamped by isostatic pressing.

The edges of the unfired ceramic laminate were cut in the lamination direction by a cutting machine. The resultant pieces were observed by microscopy to determine the notch depth using the red second ceramic green sheets as a reference. This notch depth was then input into the cutting machine, with which notches were formed on a main surface of the unfired ceramic laminate. The notches had pitches of 9 mm in the longitudinal direction and 10 mm in the lateral direction.

The unfired ceramic laminate, having the notches, was fired at 900° C. in air. The second ceramic green sheets were then removed from the fired ceramic laminate to provide the fired substrate ceramic laminate. Observation of the exterior of the substrate ceramic laminate showed that the substrate ceramic laminate did not exhibit color shading. This result demonstrated that the colorant was completely burned off from the second ceramic green sheets. Through the above process, a total of 50 substrate ceramic laminates having notches were prepared. These substrate ceramic laminates are referred to as a sample group A.

On the other hand, an additional 50 unfired ceramic laminates were prepared in the same way except that second ceramic green sheets used for these ceramic laminates contain no colorant. The notch depth was calculated from the thickness of the first and second ceramic green sheets. The notch depth was then input into the cutting machine, with which notches were formed on a main surface of each unfired ceramic laminate. The notches had pitches of 9 mm in the longitudinal direction and 10 mm in the lateral direction.

The unfired ceramic laminates, having the notches, were fired at 900° C. in air. The second ceramic green sheets were then removed from the fired ceramic laminates to provide fired substrate ceramic laminates. These 50 fired substrate ceramic laminates having the notches are referred to as a sample group B.

Wiring patterns formed on the substrate ceramic laminates in the sample groups A and B were plated with Ni, plated with Au, and provided with chip capacitors. Finally, the substrate ceramic laminates were divided along the notches.

The sample groups A and B were checked for (1) the number of laminates having cracks caused during preparation of the substrate ceramic laminates, (2) the number of laminates having cracks caused during the plating, (3) the number of laminates having cracks caused during provision with the chip capacitors, (4) the number of laminates having cracks caused during the division of the substrate ceramic laminates, and (5) the number of laminates having chips caused during the division of the substrate ceramic laminates. Table 1 shows these results, where the laminates having cracks or chips were excluded from the sample groups after each step.

TABLE 1

|  | (1) | (2) | (3) | (4) | (5) |
| --- | --- | --- | --- | --- | --- |
| sample group A | 0/50 | 0/50 | 0/50 | 0/50 | 0/50 |
| sample group B | 12/50 | 5/38 | 3/33 | 3/30 | 5/27 |

Referring to Table 1, cracks and chips were not found on the ceramic laminates in the sample group A at any step. In contrast, cracks or chips were found on the ceramic laminates in the sample group B at every step. Finally, only 22 usable ceramic laminates were provided from the sample group B. These results show that the notches on the ceramic laminates, which included the colored second ceramic green sheets, in the sample group A had the proper depth.

INDUSTRIAL APPLICABILITY

As described above, the present invention provides a valuable method for manufacturing ceramic composites such as monolithic ceramic capacitors and ceramic multi-layer substrates.

The invention claimed is:

1. A method for manufacturing ceramic composites, comprising:
   providing an unfired laminate comprising at least one first ceramic layer comprising a first ceramic material and at least one second ceramic layer comprising a second ceramic material and having a different color from the first ceramic layer;
   cutting the edges of the unfired ceramic laminate;
   observing the unfired ceramic laminate to determine notch depth by using the color of the second ceramic layer as a reference;
   and forming notches on the surface of the unfired ceramic laminate based on the determined notch depth
   firing the unfired ceramic laminate; and
   dividing the fired ceramic laminate along the notches on the surface thereof.

2. The method for manufacturing ceramic composites according to claim 1, wherein second ceramic layer comprises a colorant.

3. The method for manufacturing ceramic composites according to claim 2, wherein the ends of the notches are formed to terminate in a second ceramic layer.

4. The method for manufacturing ceramic composites according to claim 2, wherein the ends of the notches are formed to extend through a second ceramic layer.

5. The method for manufacturing ceramic composites according to claim 2, wherein a first ceramic layer is disposed at a surface of the laminate and a second ceramic layer is disposed adjacent thereto and wherein the ends of the notches are formed to terminate in the surface disposed first ceramic layer.

6. The method for manufacturing ceramic composites according to claim 2, wherein the colorant is burned off during the firing.

7. The method for manufacturing ceramic composites according to claim 6, wherein the colorant is an azo dye.

8. The method for manufacturing ceramic composites according to claim 2, wherein the colorant is an azo dye.

9. The method for manufacturing ceramic composites according to claim 8, wherein the azo dye is present in an amount of 0.01 weight percent or less.

10. The method for manufacturing ceramic composites according to claim 9, wherein the azo dye present in an amount of 0.005 weight percent or less.

11. The method for manufacturing ceramic composites according to claim 9, wherein the provided unfired ceramic laminate has top and bottom surfaces of at least one unfired second ceramic layer sandwiching an unfired substrate ceramic laminate having a pair of opposed surfaces with a first ceramic layer disposed on one of the opposed surfaces of the substrate ceramic laminate, the second ceramic material of the surface disposed second ceramic layers being unsinterable at a sintering temperature of the first ceramic material;

the ends of the notches are formed to extend through said surface disposed second ceramic layer into the substrate ceramic laminate;

the unfired ceramic laminate is fired at a temperature at which the first ceramic material is sintered and the second ceramic material is not sintered; and wherein said surface disposed second ceramic layers are removed from the fired ceramic laminate before the fired ceramic laminate is divided along the notches on the surface thereof.

12. The method for manufacturing ceramic composites according to claim 11, wherein a ceramic layer comprises a colorant.

13. The method for manufacturing ceramic composites according to claim 12, wherein the colorant is burned off during the firing.

14. The method for manufacturing ceramic composites according to claim 1, further comprising mounting a component on a main surface of the fired ceramic laminate.

15. The method for manufacturing ceramic composites according to claim 1, further comprising forming said unfired laminate.

* * * * *